United States Patent
Haggag et al.

(10) Patent No.: US 6,215,698 B1
(45) Date of Patent: Apr. 10, 2001

(54) FLASH EPROM WITH BYTE-WIDE ERASURE

(75) Inventors: Hosam Haggag, Mountain View; Albert Bergemont, Palo Alto, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/580,711

(22) Filed: May 30, 2000

(51) Int. Cl.$^7$ ..................................... G11C 16/04
(52) U.S. Cl. ................. 365/185.05; 365/185.18; 365/185.28; 365/185.29
(58) Field of Search ................ 365/185.05, 185.18, 365/185.28, 185.29

(56) References Cited

U.S. PATENT DOCUMENTS

| | | | |
|---|---|---|---|
| 5,734,609 | * 3/1998 | Choi et al. | 365/185.05 |
| 5,898,615 | * 4/1999 | Chida | 365/185.05 |
| 5,953,250 | * 9/1999 | Hsu et al. | 365/185.11 |
| 6,046,938 | * 4/2000 | Hong et al. | 365/185.05 |

* cited by examiner

*Primary Examiner*—Son T. Dinh
(74) *Attorney, Agent, or Firm*—Pillsbury Winthrop LLP

(57) ABSTRACT

Bytes of cells in a Flash electrically-programmable read-only-memory (EPROM) are individually erasable by breaking each row of memory cells into byte-wide segments of memory cells, and utilizing a source access transistor with each segment of memory cells to control the source voltage on each segment of memory cells.

18 Claims, 2 Drawing Sheets

FLASH EPROM WITH BYTE-WIDE ERASURE

BACKGROUND OF THE INVENTION

1. Field of the Invention.

The present invention relates to a Flash EPROM and, more particularly, to a Flash EPROM with byte-wide erasure.

2. Description of the Related Art.

A non-volatile memory cell is a semiconductor device that stores information even after power has been removed from the device. One type of non-volatile memory cell is known as a Flash electrically-programmable read-only-memory (EPROM) cell.

In operation, Flash EPROM cells are programmed and read in the same fashion as conventional UV erasable EPROM cells. On the other hand, Flash EPROM cells are erased in the same fashion as conventional electrically-erasable programmable read-only-memory (EEPROM) cells.

When arrays of Flash cells were initially introduced commercially, the erase operation was typically limited to bulk erasure such that all of the cells in an array are erased at the same time. Since then, Flash EPROM arrays have been disclosed which teach row and byte-wide erasure.

FIG. 1 shows a schematic diagram that illustrates a portion of a conventional byte-erasable Flash EPROM 100. As shown in FIG. 1, Flash EPROM 100 includes a number of Flash EPROM memory cells 110 that are arranged in rows and columns.

Each row of memory cells is broken into a number of byte-wide segments 120. For example, the first row is broken into bytes 1 and 3, while the second row is broken into bytes 2 and 4. In addition, each row of memory cells has an adjacent row of memory cells that share a common source line segment 112.

Each memory cell 110, in turn, has a source region S connected to a common source line segment 112, a drain region D, and a channel region that is defined between the source region S and drain region D. Further, each memory cell 110 has a floating gate that is formed over, and insulated from, the channel region, and a control gate that is formed over, and insulated from, the floating gate.

As further shown in FIG. 1, Flash EPROM 100 also includes a number of source access transistors 122 that are arranged in rows and columns so that a source access transistor 122 corresponds with each byte-wide segment 120. Each source access transistor 122 has a source, a gate, and a drain connected to the common source line segment 112 that is connected to each source region S in the corresponding byte-wide segment.

Flash EPROM 100 additionally includes a series of word lines WL1–WLn that are arranged in rows so that each word line WL has both a corresponding row of memory cells 110, and a corresponding row of source access transistors 122. Each word line WL is connected to the control gate of each memory cell 110 in the corresponding row of memory cells 110, and to the gate of each source access transistor 122 in the corresponding row of source access transistors 122.

Further, Flash EPROM 100 also includes a series of bit lines BL0–BLm and a series of source lines SL0–SLr. Bit lines BL0–BLm are arranged in columns so that each bit line BL has a corresponding column of memory cells 110. In addition, each bit line BL is connected to the drain of each memory cell in the corresponding column of memory cells 110.

Source lines SL0–SLr are arranged in columns so that each source line SL has a corresponding column of source access transistors 122. In addition, each source line SL is connected to the source of each source access transistor 122 in the corresponding column of memory cells 110.

Thus, FIG. 1 shows a schematic representation of four bytes of data: bytes 1 and 3 which are segments of the first row and thereby share the same word line WL1, and bytes 2 and 4 which are segments of the second row and thereby share the same word line WLn. Further, bytes 1 and 2 share the same bit lines BL0–BL7 and the same source line SL0, while bytes 3 and 4 share the same bit lines BL8–BLm and the same source line SLr.

In operation, memory cells 110 are programmed row by row via channel hot electron (CHE) injection by placing a programming voltage on the word line WL that corresponds with the row of cells to be programmed. For example, if the first row of cells is to be programmed, then the programming voltage is placed on word line WL1.

In addition, a bit line voltage is placed on each of the bit lines BL0–BLm that are connected to a to-be-programmed memory cell 110. For example, if only memory cell 1-1 in byte 1 is to be programmed, then the bit line voltage is placed on bit line BL0. The remaining bit lines, BL1–BLm in the above example, along with the remaining word lines WL2–WLn, are connected to ground. Further, ground is placed on all of the source lines SL0–SLr.

Memory cells 110 are read row by row by placing a read voltage on the word line WL that corresponds with the row of cells to be read. For example, if the first row of cells is to be read, then the read voltage is placed on word line WL1.

In addition, the bit line voltage is placed on each of the bit lines BL0–BLm that are connected to the memory cells 110 in the row of cells to be read. For example, if the first row of cells is to be read, then, then the bit line voltage is placed on bit lines BL0–BLm. The remaining word lines WLn are connected to ground. Further, ground is placed on all of the source lines SL0–SLr.

Memory cells 110 are erased by placing ground on the word line WL that corresponds with the segment of cells to be erased, and a positive voltage on the word line WL that corresponds with the adjacent segment of cells that share the same common source line segment 112. For example, if byte 1 in the first row of cells is to be erased, then ground is placed on word line WL1, and the positive voltage is placed on WL2.

In addition, a high positive source voltage is placed on the source line SL that corresponds with the source access transistor 122 that is connected to the segment of cells to be erased. For example, if byte 1 is to be erased, then the high positive source line voltage is placed on source line SL0. The remaining source lines SLr, along with the remaining word lines WL3–WLn are connected to ground. Further, each of the bit lines BL0–BLm is floated.

Under these bias conditions, ground is applied to word line WL1 and the high positive source voltage is applied to the sources of the memory cells in byte 1 via the source access transistor 122 in the adjacent row and source line SL0. The voltages on the word line and the sources set up an electric field that causes electrons to tunnel from the floating gate to the source region in each memory cell in byte 1.

Although the above-described structure of Flash EPROM 100 provides byte-wide erasure, there is a need for alternative structures which can also provide byte-wide erasure.

SUMMARY OF THE INVENTION

The present invention provides a Flash electrically-programmable read-only-memory (EPROM) that allows byte-wide erasure. Bytes of cells are individually erasable by breaking each row of memory cells into byte-wide segments of memory cells, and utilizing a source access transistor with each segment of memory cells to control the source voltage on each segment of memory cells.

The Flash EPROM of the present invention includes a plurality of memory cells that arranged in rows and columns. Each row of memory cells is broken into a plurality of segments where each segment has a plurality of memory cells. Each memory cell, in turn, has a control gate.

The Flash EPROM also includes a plurality of source access transistors that arranged in rows and columns so that each source access transistor has a corresponding segment. Each source access transistor has an access gate.

In addition, a series of word lines are arranged in rows so that each word line has a corresponding row of memory cells. Each word line is connected to the control gate of each memory cell in the corresponding row of memory cells.

Further, a series of access lines are arranged in rows so that each access line has a corresponding row of source access transistors. Each access line is connected to the gate of each source access transistor in the corresponding row of source access transistors.

The Flash EPROM of the present invention also includes a series of bit lines that are arranged in columns so that each bit line has a corresponding column of memory cells. Each bit line is connected to the drain of each memory cell in the corresponding column of memory cells.

In addition, the Flash EPROM includes a series of source lines that are arranged in columns so that each source line has a corresponding column of source access transistors. Each source line is connected to the source of each source access transistor in the corresponding column of memory cells.

The present invention also includes a method for programming the Flash EPROM that includes the step of placing a programming voltage on the word line that is connected to a row of cells to be programmed. The method also includes the step of placing an access voltage on the access line that is connected to the access transistors that are connected to the row of cells to be programmed. The method further includes placing a program bit line voltage on each of the bit lines that are connected to a to-be-programmed memory cell in the row of cells to be programmed.

The method for programming further includes a method for reading the Flash EPROM that includes the step of placing a read voltage on the word line that is connected to a row of cells to be read. The method also includes the step of placing an access voltage on the access line that is connected to the access transistors that are connected to the row of cells to be read. The method further includes the step of placing a read bit line voltage on each of the bit lines that are connected to a to-be-read memory cell in the row of cells to be read.

The present invention also includes a method for erasing the Flash EPROM that includes the step of placing a negative erase voltage on the word line that is connected to a segment of cells to be erased. The method also includes the step of placing an access voltage on the access line that is connected to the access transistor that is connected to the segment of cells to be erased. The method further includes the step of floating each of the bit lines that are connected to a to-be-erased memory cell in the segment of cells to be erased.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
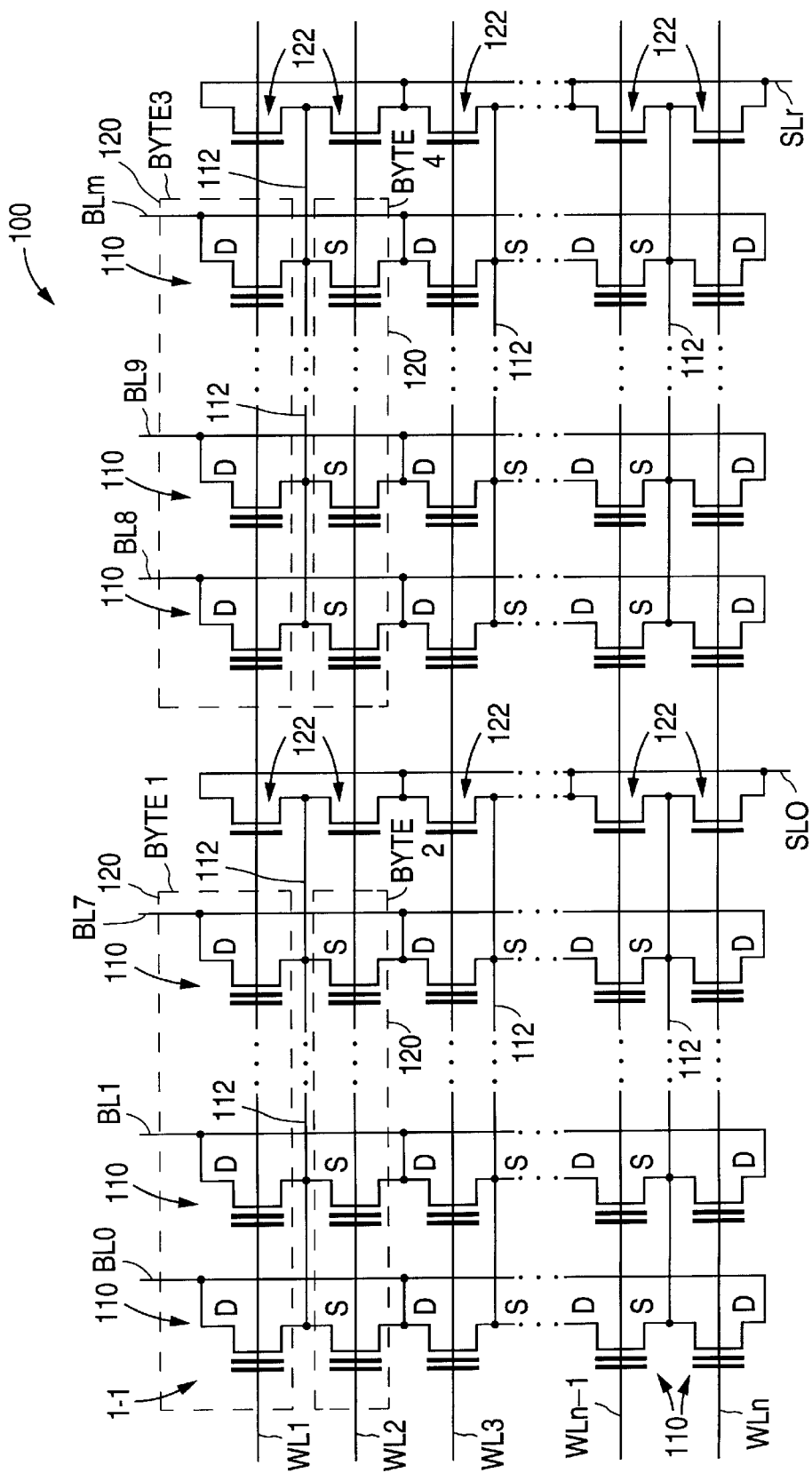
FIG. 1 is a schematic diagram illustrating a portion of a conventional byte-erasable Flash EPROM 100.
Figure 2:
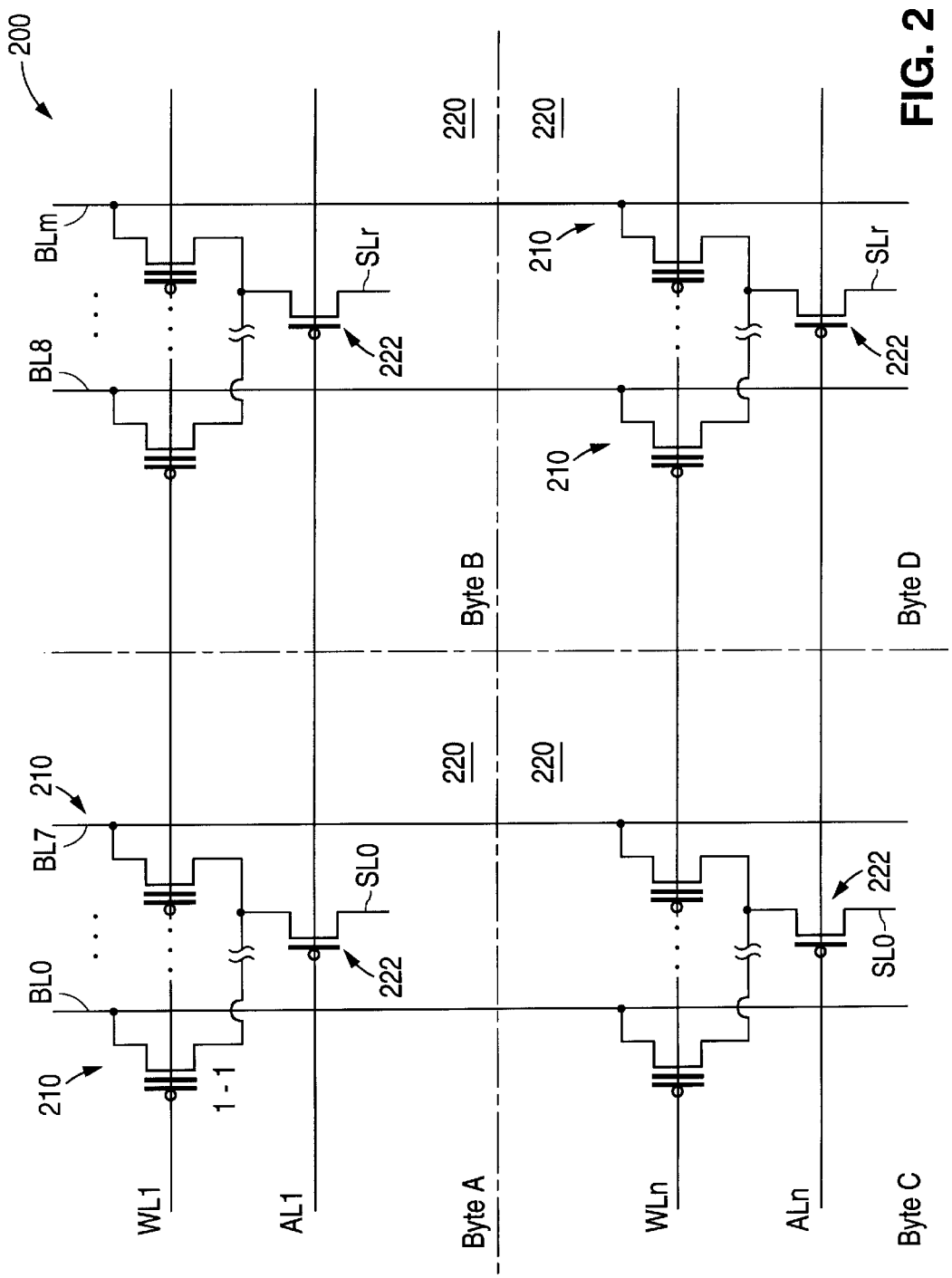
FIG. 2 is a schematic diagram illustrating a byte-erasable Flash EPROM 200 in accordance with the present invention.

FIG. 2 shows a schematic diagram that illustrates a byte-erasable Flash EPROM 200 in accordance with the present invention. As described in greater detail below, Flash EPROM 200 provides byte erasability by controlling the voltages that are placed on the sources of each byte of memory cells.

As shown in FIG. 2, Flash EPROM 200 includes a number of Flash EPROM memory cells 210 that are arranged in rows and columns. Each memory cell 210 has spaced-apart source and drain regions, and a memory channel region that is defined between the source and drain regions. Further, each memory cell 210 has a floating gate that is formed over, and insulated from, the memory channel region, and a control gate that is formed over, and insulated from, the floating gate.

In addition, each row of memory cells is broken into a number of byte-wide segments 220 that each include a number of memory cells, such as eight (a redundant cell can be included in each segment 220 to enhance reliability).

As further shown in FIG. 2, Flash EPROM 200 also includes a number of source access transistors 222 that are arranged in rows and columns so that each source access transistor 222 has a corresponding segment 220.

Each source access transistor 222 has spaced-apart source and drain regions, and an access channel region defined between the source and drain regions. The drain region of each transistor 222 is connected to the source region of each memory cell 210 in the corresponding segment of memory cells. Further, each source access transistor also has a gate that is formed over, and insulated from, the access channel region.

Flash EPROM 200 additionally includes a series of word lines WL1–WLn and a series of access lines AL1–ALn. Word lines WL1–WLn are arranged in rows so that each word line WL has a corresponding row of memory cells 210. Further, each word line WL is connected to the control gate of each memory cell 210 in the corresponding row of memory cells 210.

Access lines AL1–ALn are also arranged in rows so that each access line AL has a corresponding row of source access transistors 222. In addition, each access line AL is connected to the gate of each source access transistor 222 in the corresponding row of source access transistors 222.

Further, Flash EPROM 200 also includes a series of bit lines BL0–BLm and a series of source lines SL0–SLr. Bit lines BL0–BLm are arranged in columns so that each bit line BL has a corresponding column of memory cells 210. In addition, each bit line BL is connected to the drain of each memory cell in the corresponding column of memory cells 210.

Source lines SL0–SLr are arranged in columns so that each source line SL has a corresponding column of source access transistors 222. In addition, each source line SL is connected to the source of each source access transistor 222 in the corresponding column of memory cells 210.

Thus, FIG. 2 shows a schematic representation of four bytes of data: bytes A and B which are segments 220 of the first row and thereby share the same word and access lines WL1 and AL1, and bytes C and D which are segments 220 of the second row and thereby share the same word and access lines WLn and ALn. Further, bytes A and C share the same bit lines BL0–BL7 and the same source line SL0, while bytes B and D share the same bit lines BL8–BLm and the same source line SLr.

In operation, memory cells 210 are programmed row by row via channel hot electron (CHE) injection by placing a programming voltage on the word line WL and an access voltage on the access line AL that correspond with the row of cells to be programmed. For example, if the first row of cells is to be programmed, then the programming voltage is placed on word line WL1, and the access voltage is placed on access line AL1.

In addition, a program bit line voltage is placed on each of the bit lines BL0–BLm that are connected to a to-be-programmed memory cell 210. For example, if memory cell 1-1 in byte A is to be programmed, then the program bit line voltage is placed on bit line BL0. The remaining bit lines, BL1–BLm in the above example, along with the remaining word lines WLn and access lines ALn, are connected to ground. Further, ground is placed on all of the source lines SL0–SLr.

Under these bias conditions, the programming voltage applied to word line WL1 sets up an electric field that causes electrons to be attracted to the surfaces of the channel regions below the floating gates of the memory cells in the first row. In addition, the program bit line voltage placed on the drain of memory cell 1-1 via bit line BL0, and ground placed on the source of memory cell 1-1 via transistor 222 and source line SL0 sets up a drain-to-source electric field in memory cell 1-1.

When enough electrons accumulate on the surface of the memory channel region of cell 1-1 to allow electrons to flow from the source region to the drain region under the influence of the drain-to-source electric field, the channel is said to be inverted.

When the channel is inverted, a number of the electrons flowing from the source region have energetic collisions with the lattice near the drain region which, in turn, form channel hot electrons. A number of the channel hot electrons move toward the floating gate and, under the influence of the voltage placed on word line WL1, are injected onto the floating gate of memory cell 1-1.

Memory cells 210 are read row by row by placing a read voltage on the word line WL and the access voltage on the access line AL that correspond with the row of cells to be read. For example, if the first row of cells is to be read, then the read voltage is placed on word line WL1, and the access voltage is placed on access line AL1.

In addition, a read bit line voltage is placed on each of the bit lines BL0–BLm that are connected to the memory cells 210 in the row of cells to be read. For example, if the first row of cells is to be read, then the read bit line voltage is placed on bit lines BL0–BLm. The remaining word lines WLn and access lines ALn are connected to ground. Further, ground is placed on all of the source lines SL0–SLr.

Under these bias conditions, when a memory cell in the first row, such as memory cell 1-1, is unprogrammed, the read voltage applied to word line WL1 is sufficient to invert the channel region, thereby allowing electrons to flow from the source region to the drain region. The electron flow pulls down the voltage on the bit line BL connected to the memory cell which, in turn, is detected as an unprogrammed cell.

On the other hand, when the memory cell is programmed, the read voltage applied to word line WL1 is insufficient to invert the channel region. As a result, no electrons flow from the source region to the drain region. This lack of an electron flow prevents the voltage on the bit line BL from being pulled down which, in turn, is detected as an programmed cell.

In accordance with the present invention, memory cells 210 can be erased by bytes (segments 220) and by rows as well as by blocks (sectors). In addition, the entire array can be erased simultaneously. To erase a byte of memory cells, a negative erase voltage is placed on the word line WL and the access voltage is placed on the access line AL that correspond with the byte of cells to be erased. For example, if byte A in the first row of cells is to be erased, then the negative erase voltage is placed on word line WL1, and the access voltage is placed on access line AL1.

In addition, a positive source voltage is placed on the source line SL that corresponds with the source access transistor 222 that is connected to the byte of cells to be erased. For example, if byte A is to be erased, then the positive source line voltage is placed on source line SL0. The remaining source lines SL1–SLr, along with the remaining word lines WLn and access lines ALn, are connected to ground. Further, each of the bit lines BL0–BLm is floated.

Under these bias conditions, the negative erase voltage applied to word line WL1 and the positive source voltage applied to the sources of the memory cells in byte A via source access transistor 222 and source line SL0 set up an electric field that causes electrons to tunnel from the floating gate to the source region in each memory cell 210 in byte A via the well-known Fowler-Nordheim mechanism.

Although the negative erase voltage applied to word line WL1 is also applied to the control gates of the memory cells in byte B in the above example, the memory cells in byte B are not erased because ground is placed on the sources of the memory cells in byte B via source access transistor 222 and source line SLr.

The negative erase voltage applied to word line WL1 and ground applied to source line SLr do set up an electric field, but the electric field is to weak to cause significant numbers of electrons to tunnel from the floating gate to the source region in each memory cell in byte B.

In addition, although the positive source voltage applied to source line SL0 is also applied to the source access transistor 222 in byte C in the above example, the source access transistor 222 in byte C is turned off because ground is placed on the access line ALn. In addition, ground is also placed on the word line WLn. As a result, the memory cells in byte C are not erased.

To erase multiple bytes of memory cells in the same row, the negative erase voltage is placed on the word line WL that corresponds with the bytes of cells to be erased, and the positive source voltage is placed on the source lines SL that correspond with the source access transistors 222 that are connected to the bytes of cells to be erased.

For example, if bytes A and B are to be erased, then the negative erase voltage is placed on word line WL1, and the positive source line voltage is placed on source lines SL0 and SLr. The remaining source lines SL remain connected to ground.

Similarly, to erase a row of memory cells, the negative erase voltage is placed on the word line WL, and the positive source voltage is placed on all of the source lines SL. To erase a sector of memory cells, the positive source voltage is placed on all of the source lines SL, and the negative erase voltage is placed on all of the word lines WL in the sector.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A Flash electrically-programmable read-only-memory (EPROM) comprising:

a plurality of memory cells arranged in rows and columns, each row of memory cells being broken into a plurality of segments, each segment having a plurality of memory cells, each memory cell having a control gate;

a plurality of source access transistors arranged in rows and columns so that each source access transistor has a corresponding segment, each source access transistor having an access gate;

a series of word lines arranged in rows so that each word line has a corresponding row of memory cells, each word line being connected to the control gate of each memory cell in the corresponding row of memory cells;

a series of access lines arranged in rows so that each access line has a corresponding row of source access transistors, each access line being connected to the gate of each source access transistor in the corresponding row of source access transistors, the access lines being spaced apart from the word lines;

a series of bit lines arranged in columns so that each bit line has a corresponding column of memory cells, each bit line being connected to the drain of each memory cell in the corresponding column of memory cells; and a series of source lines arranged in columns so that each source line has a corresponding column of source access transistors, each source line being connected to the source of each source access transistor in the corresponding column of memory cells.

2. The Flash EPROM of claim 1 wherein each memory cell has spaced-apart source and drain regions, a memory channel region defined between the source and drain regions, a floating gate formed over, and insulated from, the memory channel region, and the control gate formed over, and insulated from, the floating gate.

3. The Flash EPROM of claim 1 wherein the segments are byte wide.

4. The Flash EPROM of claim 1 wherein each segment includes a redundant memory cell.

5. The Flash EPROM of claim 1 wherein each source access transistor has spaced-apart access source and drain regions, an access channel region defined between the access source and drain regions, and the access gate formed over, and insulated from, the access channel region, the drain region of a source access transistor being connected to the source region of each memory cell in the segment that corresponds with the source access transistor.

6. A method for operating a Flash electrically-programmable read-only-memory (EPROM), the Flash EPROM comprising:

a plurality of memory cells arranged in rows and columns, each row of memory cells being broken into a plurality of segments, each segment having a plurality of memory cells, each memory cell having a control gate;

a plurality of source access transistors arranged in rows and columns so that each source access transistor has a corresponding segment, each source access transistor having an access gate;

a series of word lines arranged in rows so that each word line has a corresponding row of memory cells, each word line being connected to the control gate of each memory cell in the corresponding row of memory cells;

a series of access lines arranged in rows so that each access line has a corresponding row of source access transistors, each access line being connected to the gate of each source access transistor in the corresponding row of source access transistors, the access lines being spaced apart from the word lines;

a series of bit lines arranged in columns so that each bit line has a corresponding column of memory cells, each bit line being connected to the drain of each memory cell in the corresponding column of memory cells; and a series of source lines arranged in columns so that each source line has a corresponding column of source access transistors, each source line being connected to the source of each source access transistor in the corresponding column of memory cells, the method comprising the programming steps of:

placing a programming voltage on the word line connected to a row of cells to be programmed;

placing an access voltage on the access line connected to the row of cells to be programmed; and placing a program bit line voltage on each of the bit lines that are connected to a to-be-programmed memory cell in the row of cells to be programmed.

7. The method of claim 6 and further comprising the step of placing ground on each bit line not connected to a to-be-programmed memory cell.

8. The method of claim 6 and further comprising the step of placing ground on each word line not connected to the row of cells to be programmed.

9. The method of claim 6 and further comprising the step of placing ground on each access line not connected to the row of cells to be programmed.

10. The method of claim 6 and further comprising the read steps of:

placing a read voltage on the word line connected to a row of cells to be read;

placing an access voltage on the access line connected to the row of cells to be read; and placing a read bit line voltage on each of the bit lines connected to a to-be-read memory cell in the row of cells to be read.

11. The method of claim 10 and further comprising the step of placing ground on each word line not connected to the row of cells to be read.

12. The method of claim 10 and further comprising the step of placing ground on each access line not connected to the row of cells to be read.

13. The method of claim 6 wherein each memory cell has spaced-apart source and drain regions, a memory channel region defined between the source and drain regions, a floating gate formed over, and insulated from, the memory channel region, and the control gate formed over, and insulated from, the floating gate.

14. A method for operating a Flash electrically-programmable read-only-memory (EPROM), the Flash EPROM comprising:

a plurality of memory cells arranged in rows and columns, each row of memory cells being broken into a plurality of segments, each segment having a plurality of memory cells, each memory cell having a control gate;

a plurality of source access transistors arranged in rows and columns so that each source access transistor has a corresponding segment, each source access transistor having an access gate;

a series of word lines arranged in rows so that each word line has a corresponding row of memory cells, each word line being connected to the control gate of each memory cell in the corresponding row of memory cells;

a series of access lines arranged in rows so that each access line has a corresponding row of source access transistors, each access line being connected to the gate of each source access transistor in the corresponding row of source access transistors, the access lines being spaced apart from the word lines;

a series of bit lines arranged in columns so that each bit line has a corresponding column of memory cells, each bit line being connected to the drain of each memory cell in the corresponding column of memory cells; and a series of source lines arranged in columns so that each source line has a corresponding column of source access transistors, each source line being connected to the source of each source access transistor in the corresponding column of memory cells, the method comprising the segment erasing steps of:
placing a negative erase voltage on the word line connected to a segment of cells to be erased;
placing an access voltage on the access line connected to the segment of cells to be erased; and
floating each of the bit lines that are connected to a to-be-erased memory cell in the segment of cells to be erased.

15. The method of claim 14 wherein a segment is byte wide.

16. The method of claim 14 and further comprising the step of placing ground on each word line not connected to the segment of cells to be erased.

17. The method of claim 14 and further comprising the step of placing ground on each access line not connected to the segment of cells to be erased.

18. The method of claim 14 and further comprising the read steps of:

placing a read voltage on the word line connected to a row of cells to be read;

placing an access voltage on the access line connected to the row of cells to be read; and placing a read bit line voltage on each of the bit lines connected to a to-be-read memory cell in the row of cells to be read.

* * * * *